US006946909B2

(12) United States Patent

Barnett

(10) Patent No.: US 6,946,909 B2

(45) Date of Patent: Sep. 20, 2005

(54) IMPEDANCE MATCHED LOW NOISE AMPLIFIER

(75) Inventor: Raymond Elijah Barnett, W. Apple Valley, MN (US)

(73) Assignee: Texas Instruments Incorporated, Dallas, TX (US)

(*) Notice: Subject to any disclaimer, the term of this patent is extended or adjusted under 35 U.S.C. 154(b) by 17 days.

(21) Appl. No.: 10/670,069

(22) Filed: Sep. 24, 2003

(65) Prior Publication Data

US 2005/0062535 A1 Mar. 24, 2005

(51) Int. Cl.[7] .............................. H03F 3/45; G11B 5/09

(52) U.S. Cl. .......................... 330/252; 330/260; 360/46

(58) Field of Search ................................ 330/252, 259, 330/260

(56) References Cited

U.S. PATENT DOCUMENTS 5,798,664 A * 8/1998 Nagahori et al. ........... 330/259

6,473,253 B1 * 10/2002 Bhandari et al. ........... 330/260

6,822,817 B2 * 11/2004 Chung et al. ............... 330/252

* cited by examiner

*Primary Examiner*—Khanh V. Nguyen

(74) *Attorney, Agent, or Firm*—W. Daniel Swayze, Jr.; W. James Brady; Frederick J. Telecky, Jr.

(57) ABSTRACT

The present invention discloses an impedance matched low noise amplifier circuit (10) comprising a serially coupled first resistor (R1) and first transistor (R0), a serially coupled second resistor (R2) and second transistor (R1), a resistive sensor (RMR) coupled to the first transistor (R0) and the second transistor (R1), wherein the first resistor (R1) and the second resistor (R2) are coupled, and a transconductance feedback block (GM) coupled to the resistive sensor (RMR) and to the serially coupled resistors (R1, R2) and transistors (R0, R1).

23 Claims, 1 Drawing Sheet

IMPEDANCE MATCHED LOW NOISE AMPLIFIER

FIELD OF THE INVENTION

The present invention relates to impedance matched low noise amplifiers and, more particularly, to an impedance matched low noise amplifier using feedback to achieve low noise and impedance matching.

BACKGROUND OF THE INVENTION

The present invention achieves advantages as an impedance matched low noise amplifier. Prior designs that provide impedance matching while maintaining low noise are based on a low noise high impedance amplifier with negative feedback to provide a matched-impedance at the input. Such designs work adequately but suffer from noise boosting that is dependent on the parasitic input capacitance and open loop gain of the high impedance amplifier. The present invention uses a low impedance low noise amplifier and uses positive gm feedback to boost the input impedance to a desired matched value. The net result is an impedance-matched amplifier with noise performance similar to the low impedance amplifier before feedback is applied.

SUMMARY OF THE INVENTION

In one embodiment of the present invention, an impedance matched low noise amplifier circuit comprises a serially coupled first resistor and first transistor, a serially coupled second resistor and second transistor, a resistive sensor coupled to the first transistor and the second transistor, wherein the first resistor and the second resistor are coupled, and a transconductance feedback block coupled to the resistive sensor and to the serially coupled resistors and transistors.

In another embodiment of the present invention, a method for increasing an input impedance of an amplifier comprises determining an input impedance at each of a first transistor and a second transistor, matching the input impedance to an impedance of an interconnect between the inputs of the first transistor and the second transistor, conducting data signals from a resistive sensor coupled to the first transistor and the second transistor to the inputs, and decreasing current to the transistors, by a transconductance feedback block coupled to the resistive sensor and to the transistors, by an amount dependant on the voltage between the transistors.

DETAILED DESCRIPTION OF THE INVENTION

Circuit Description

Figure 1:
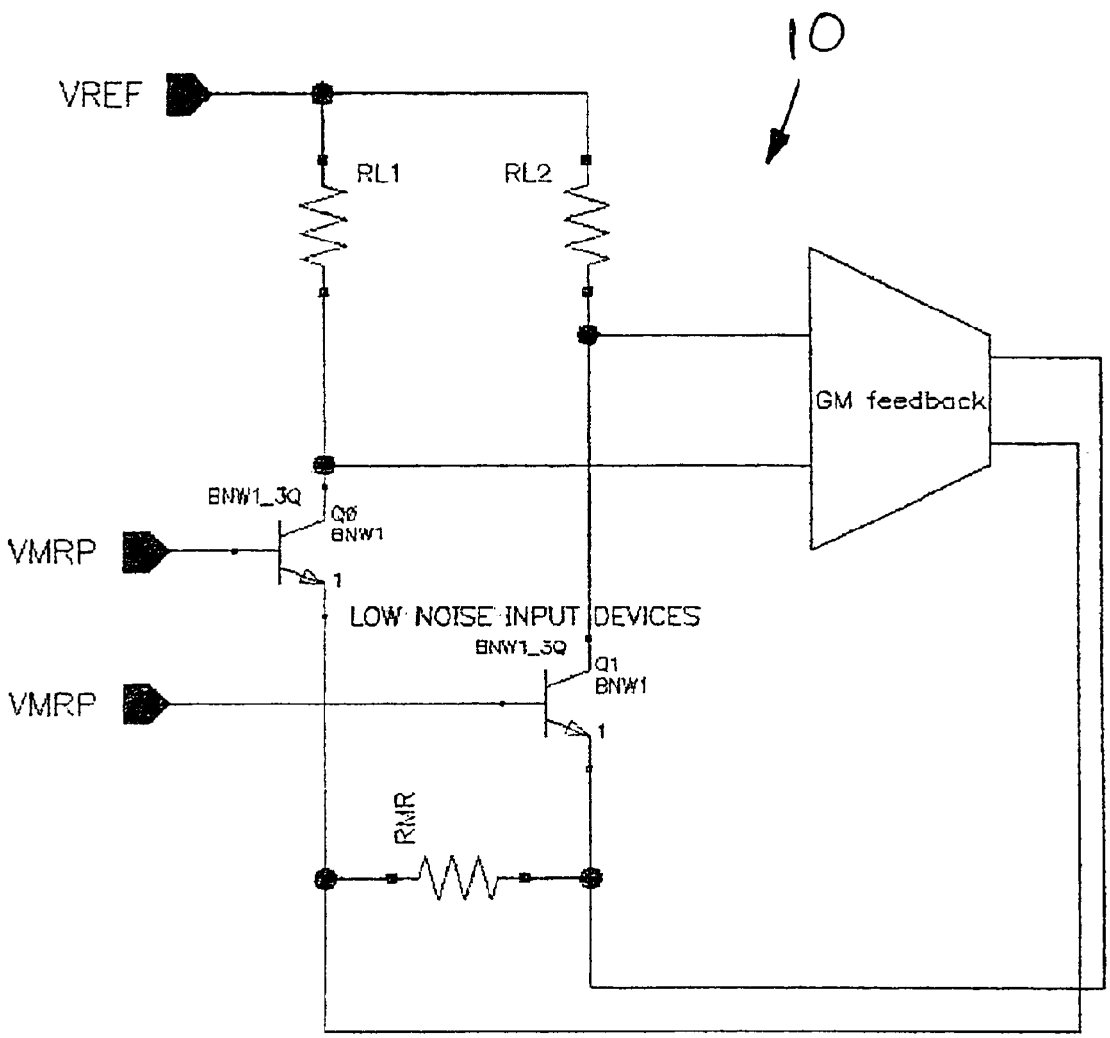
FIG. 1 illustrates an impedance matched low noise amplifier in accordance with an exemplary embodiment of the present invention.

Referring now to FIG. 1, an impedance matched low noise amplifier circuit 10 consists of low noise transistors Q0 and Q1 (which may be MOS or Bipolar transistors), load resistors RL1 and RL2, resistive sensor RMR, and transconductance feedback block GM.

The base of transistor Q0 is connected to supply voltage VMRP. Load resistor RL1 is connected between the collector of Q0 and supply voltage VREF. The emitter of transistor Q0 is connected to one end of resistive sensor RMR. The other end of resistive sensor RMR is connected to the emitter of transistor Q1. The base of transistor Q1 is connected to supply voltage VMRP. Load resistor RL2 is connected between the collector of Q1 and supply voltage VREF. The common node of resistor RL2 and the collector of transistor Q1 is connected to the second input of the transconductance feedback block GM. The common node of resistor RL1 and the collector of transistor Q0 is connected to first input of the transconductance feedback block GM. The first output of the transconductance feedback block GM is connected to the common node of the emitter of transistor Q0 and the resistive sensor RMR. The second output of the transconductance feedback block GM is connected to the common node of the emitter of transistor Q1 and the resistive sensor RMR.

Circuit Operation

In the low noise amplifier circuit 10, transistor Q0 and transistor Q1 perform as common-base amplifiers. The input of each common-base amplifier is at its transistor's emitter. The output of each common-base amplifier is at its transistor's collector. In order for the common-base amplifiers at Q0 and Q1 to have the best noise performance, a low input impedance results. For a common-base amplifier, the input impedance will decrease as the emitter current is increased. Increasing the emitter current reduces the noise generated by the amplifier. As such, low-noise common-base amplifiers result in low impedance inputs. It is noted that if MOS transistors were used in the circuit 10, they would perform as common-gate amplifiers. In such a situation, the input of each common-gate amplifier would be at its transistor's source, and the output of each common-gate amplifier would be at its transistor's drain.

For the circuit 10, the input impedance of each common-base amplifier is determined by the bias current supplied to the emitter of each of transistors Q0 and Q1. The circuit to supply this bias current to the emitters of transistor Q0 and transistor Q1 is not shown.

The low input impedance at each of the common-base amplifiers at Q0 and Q1 may not provide a good match to the impedance of the interconnect between the resistive sensor RMR and the inputs of the common-base amplifiers. It is desirable to have the input impedance of the common-base amplifiers Q0 and Q1 be matched to the impedance of the interconnect between these amplifier inputs in order for data signals from the resistive sensor RMR to be conducted to the inputs of the amplifiers with the best signal quality. When data is being sensed by the resistive sensor RMR, this data will be seen as a positive or negative voltage difference across RMR. It is this voltage across resistive sensor RMR that represents data being read from a hard disk in a disk drive storage device. This voltage across RMR will appear at the input of each common-base amplifier at Q0 and Q1. When the voltage across resistive sensor RMR changes, this voltage change will be amplified by the common-base amplifiers and will cause a change in the output voltage at the collector of each of transistors Q0 and Q1. Thus, the voltage between the collectors of Q0 and Q1 will change in response to the change in voltage across the resistive sensor RMR.

The transconductance feedback block GM will act to reduce the AC current to the emitters of Q0 and Q1 by an amount that is dependant on the AC voltage between the collectors of Q0 and Q1 and the gain of the transconductance feedback block GM. This decrease in the emitter AC current will cause an increase in the input impedance of the common-base amplifiers at Q0 and Q1. Thus, the input impedance of the common-base amplifiers at Q0 and Q1 will be increased by an amount that is proportional to the voltage between the input connections of the transconductance feedback block GM. The noise behavior of the front end amplifier is only slightly increased by the AC feedback. Thus, low-noise can be achieved by choosing a high bias current and the input impedance of the amplifier can be raised with positive gm feedback. This results in near independent control of noise behavior and input impedance for the amplifier.

Circuit Summary

The impedance matched low noise amplifier circuit 10 of the present invention utilizes a common base amplifier consisting of Q0 and Q1 and load resistors RL1 and RL2 with gm feedback to achieve low noise and impedance matching. The gm feedback boosts the low impedance at Q0 and Q1 emitters to a level that is adequate for impedance matching the amplifier front end to the interconnect that leads to the RMR sensor. The impedance at the emitters of Q0 and Q1 before feedback is applied is driven low to achieve low noise. This is achieved by increasing the bias current of Q0 and Q1 that in turn reduces the impedance. The impedance reduction from an AC signal standpoint is not desirable if the impedance is driven lower than the desired matching impedance. Typical impedance for low noise is on the order of 15 ohms differential. Desired impedance for matching is on the order of 70 ohms differential. The gm feedback allows the amplifier to run at a noise impedance of 15 while AC impedance can be tuned up to match the interconnect.

Although an exemplary embodiment of the present invention has been illustrated in the accompanied drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. An impedance matched low noise amplifier circuit, comprising:

a serially coupled first resistor and first transistor;

a serially coupled second resistor and second transistor;

a resistive sensor directly coupled to the first transistor and the second transistor;

wherein the first resistor and the second resistor are interconnected; and a transconductance feedback block directly coupled between the resistive sensor and the serially coupled resistors and transistors.

2. The circuit of claim 1 further comprising a first supply voltage coupled to the first transistor and to the second transistor.

3. The circuit of claim 1 further comprising a second supply voltage coupled to the first resistor and to the second resistor.

4. The circuit of claim 1, wherein a voltage across the resistive sensor represents data being read from a hard disk in a disk drive storage device.

5. The circuit of claim 1, wherein the transistors are low noise transistors.

6. The circuit of claim 1, wherein the transistors are MOS transistors.

7. The circuit of claim 1, wherein the transistors are bipolar transistors.

8. The circuit of claim 1, wherein the transistors perform as common-base amplifiers.

9. The circuit of claim 1, wherein the transistors perform as common-gate amplifiers.

10. A method for increasing an input impedance of an amplifier, comprising:

determining an input impedance at each of a first transistor and a second transistor;

matching the input impedance to an impedance of an interconnect between inputs of the first transistor and the second transistor;

conducing data signals from a resistive sensor directly coupled to the first transistor and the second transistor to the inputs; and decreasing current to the transistors, by a transconductance feedback block directly coupled between the resistive sensor and the transistor, by an amount dependent on a voltage between the transistors.

11. The method of claim 10 further comprising determining the input impedance by a bias current supplied to each of the transistors.

12. The method of claim 10 further comprising producing a positive voltage or a negative voltage across the resistive sensor based on the data signals.

13. The method of claim 12, wherein the voltage across the resistive sensor represents data being read from a hard disk in a disk drive storage device.

14. The method of claim 12, wherein the voltage across the resistive sensor appears at the input of each of the transistors.

15. The method of claim 12 further comprising, if the voltage across the resistive sensor changes, amplifying the voltage by the transistors.

16. The method of claim 15 further comprising changing an output voltage at each of transistors based on the voltage change.

17. The method of claim 10 further comprising increasing the input impedance of the transistors based on the decreasing current.

18. The method of claim 10 further comprising increasing the input impedance by an amount that is proportional to a voltage between input connections of the transconductance feedback block and the gain of the transconductance feedback block.

19. The method of claim 10 further comprising achieving low-noise at the transistors by choosing a high bias current.

20. The method of claim 10 further comprising increasing the input impedance with positive feedback from the transconductance feedback block.

21. The method of claim 10 further comprising near independently controlling noise behavior and the input impedance at the transistors.

22. The method of claim 10, wherein the transistors perform as common-base amplifiers.

23. The method of claim 10, wherein the transistors perform as common-gate amplifiers.

* * * * *